United States Patent
Chen

[11] Patent Number: 6,066,875
[45] Date of Patent: May 23, 2000

[54] METHOD OF FABRICATING SPLIT-GATE SOURCE SIDE INJECTION FLASH EEPROM ARRAY

[75] Inventor: Chih-Ming Chen, Hsinchu, Taiwan

[73] Assignee: Worldwide Semiconductor Manufacturing Corp., Taiwan

[21] Appl. No.: 09/063,032

[22] Filed: Apr. 20, 1998

[30] Foreign Application Priority Data

Nov. 25, 1997 [TW] Taiwan .................................. 86117698

[51] Int. Cl.[7] ................................................ H01L 29/788
[52] U.S. Cl. .......................... 257/316; 257/315; 257/319; 257/320; 257/321; 257/322; 438/267
[58] Field of Search .................................. 257/315, 316, 257/319, 320, 321, 322, 317; 438/267

[56] References Cited

U.S. PATENT DOCUMENTS

| | | | |
|---|---|---|---|
| 4,855,247 | 8/1989 | Ma et al. .................................. | 438/305 |
| 4,882,707 | 11/1989 | Mizutani ............................. | 365/185.12 |
| 5,444,279 | 8/1995 | Lee ........................................... | 257/316 |
| 5,498,559 | 3/1996 | Chang ...................................... | 438/258 |
| 5,618,742 | 4/1997 | Shone et al. ............................. | 438/263 |

*Primary Examiner*—Mahshid Saadat
*Assistant Examiner*—George C. Eckert, II
*Attorney, Agent, or Firm*—Blakely Sokoloff Taylor & Zafman

[57] ABSTRACT

A split-gate source side injection flash EEPROM array structure and method of fabrication that utilizes the same polysilicon layer to form the control gate and the floating gate. Furthermore, there is a tunneling oxide layer underneath the floating gate, a gate oxide layer underneath the control gate, and that the tunneling oxide layer has a thickness smaller than the gate oxide layer. Since the control gate and the floating gate are formed on a silicon layer through the same patterning process, polysilicon spacers can be used to control the gap width between the control gate and the floating gate. Therefore, a reliable and reproducible flash cell array can be produced.

22 Claims, 5 Drawing Sheets

METHOD OF FABRICATING SPLIT-GATE SOURCE SIDE INJECTION FLASH EEPROM ARRAY

CROSS-REFERENCE TO RELATED APPLICATION

This application claims the priority benefit of Taiwan application ser. no. 86117698, filed Nov. 25, 1997, the full disclosure of which is incorporated herein by reference.

BACKGROUND OF THE INVENTION

1. Field of Invention

The present invention relates to a flash memory array. More particularly, the present invention relates to a split-gate source side injection flash EEPROM array whose floating gates and control gates are fabricated from the same polysilicon layer in the same photolithographic and etching operations.

2. Description of Related Art

A conventional flash memory is a type of electrical erasable programmable read-only memory (EEPROM), which in turn is a type of non-volatile memory. In general, an EEPROM cell comprises two gates. One of the gates known as a floating gate is fabricated from polysilicon and is used for charge storage. The second gate known as the control gate is used for the controlling the input and output of data. The above floating gate is located beneath the control gate, and is generally in a floating state because there is no connection with external circuits. The control gate is normally wired to the word line. One of the characteristics of flash memory is its capacity for block-by-block memory erase. Furthermore, the speed of memory erase is fast, and normally takes just 1 to 2 seconds for the complete removal of a whole block of memory. For most other EEPROM, memory erase can take up to several minutes due to its bit-by-bit operation. Articles concerning flash memory are numerous, and one of them, which produces an improved flash memory structure, is described in U.S. Pat. No. 5,045,488, for example.

FIG. 1 is a cross-sectional view showing the flash memory cell structure according to the U.S. Pat. No. 5,045,488. As shown in FIG. 1, a floating gate 11 and a control gate 12 are formed above a silicon substrate 10. The floating gate 11 and the control gate 12, for example, are polysilicon layers. In between the floating gate 11 and the control gate 12, there is an insulating layer 13. The floating gate 11, the insulating layer 13 and the control gate 12 together constitutes a stacked-gate structure 14. On each sides of the stacked-gate structure 14, ion-doped source and drain regions 15 and 16 are formed in the substrate 10. The characteristic of this type of flash memory cell structure is the split-gate design for the stacked-gate 14. In other words, the floating gate 11 and the control gate 12 are distributed horizontally along the top of the substrate 10. Only a certain central regions of the floating gate 11 and the control gate 12 overlaps such that one is stacked on top of the other in a vertical direction. Furthermore, the floating gate 11 has sharp corners 17 for providing a high electric field, which confers a fast erase capability to the flash memory.

However, in a conventional flash memory, whether the flash memory cell is formed as a two-layered or three-layered polysilicon structure, the ideal gate control gap region formed by the overlapping of two polysilicon layers is difficult to form. For example, as shown in FIG. 1, the gap region near the corners 17 is difficult to create. Moreover, for a multi-layered polysilicon cell, due to a difference in topography, etching is rather difficult and can easily lead to residual stringer structures that result in unwanted short-circuiting between different cells. In addition, because of the existing topographical variation, patterning of the gate region cannot be simultaneously performed in the peripheral circuits and memory cell regions.

Furthermore, in conventional flash memory fabrication, usually a common source terminal is designed for increasing the level of integration and decreasing production cost. Hence, a symmetrical memory cell arrangement, for example, as shown in FIG. 1B, is created generally. Under the highly topographically dependent fabrication techniques, if there is any misalignment of layers, any characteristics that are related to the symmetrical geometry of memory cell pairs will be easily broken through the fabrication. In particular, when the channels 18 and 18' under the control gates 12 and 12' are quite different, data programming efficiency and reading current from the supposedly symmetrical memory cells will become highly unsymmetrical.

In light of the foregoing, there is a need in the art to improve the flash memory array and its method of fabrication.

SUMMARY OF THE INVENTION

Accordingly, the present invention is directed to provide a flash memory structure and its method of fabrication that utilizes the same polysilicon layer to form the floating gate and the control gate, hence able to rectify the defects caused by misalignments in a conventional fabricating technique. In addition, the width of a polysilicon spacer used in this invention is reproducible and controllable, and can be repeatedly applied to form spacers between any two memory cells no matter the spacers are in a first polysilicon layer or a second polysilicon layer. Therefore, this invention is capable of producing a reliable and replicable memory array.

To achieve these and other advantages and in accordance with the purpose of the invention, as embodied and broadly described herein, the invention provides a method of fabricating a split-gate source side injection flash EEPROM array. The method comprises the steps of providing a silicon substrate, and then forming a gate oxide layer over the substrate. Next, a split-gate mask is formed above the substrate in a location where a control gate is desired, and then a portion of the gate oxide layer is removed. The split-gate mask is then removed. Thereafter, a tunneling oxide layer is formed over the gate oxide layer. In the process of growing the tunneling oxide, the gate oxide layer is also allowed to grow thicker. Consequently, the tunneling oxide layer has a thickness smaller than the gate oxide layer, but they are adjacent to each other. Next, a first polysilicon layer and a tungsten silicide layer are sequentially formed over the gate oxide layer and the tunneling oxide layer. Subsequently, photolithographic and etching processes are used to remove a portion of the first polysilicon layer and the tungsten silicide layer forming a control gate and a floating gate. Next, a second polysilicon layer is deposited over the control gate, the floating gate and the first polysilicon layer. Then, the second polysilicon layer is etched back to form spacers on the sidewalls of the control gate and the floating gate as well as a gap between the control gate and the floating gate. Finally, two mask are used to form a source region beneath the tunneling oxide layer and a drain region beneath the gate oxide layer separately. Using the above method for forming a split-gate flash memory, gap width between the control gate and the floating gate can be easily controlled through varying the thickness of the polysilicon spacer or other conductive layer.

In another aspect, a split-gate source side injection flash EEPROM array structure is provided comprising a semiconductor substrate; a gate oxide layer formed above a portion of the substrate and having a long and narrow top profile; a tunneling oxide layer formed above a portion of the substrate, having a long and narrow top profile, and lying next to the gate oxide layer; a control gate made from a polysilicon layer formed above the gate oxide layer; a floating gate made from a polysilicon layer formed above the tunneling oxide layer; a plurality of spacers formed on the sidewalls of the control gate and the floating gate; a gap formed between the control gate and the floating gate; a source region formed in the semiconductor substrate with part of it lying underneath the floating gate; and a drain region formed in the semiconductor substrate. This flash memory structure uses the same polysilicon layer for fabricating both the floating gate and the control gate, and hence gap width between the spacers can be easily controlled.

In yet another aspect, a split-gate source side injection flash EEPROM array structure above a semiconductor substrate is provided. The flash memory structure comprises a gate oxide layer formed above a portion of the substrate and having a long and narrow top profile; a tunneling oxide layer formed above a portion of the substrate, having a long and narrow top profile, lying next to the gate oxide layer, and that the tunneling oxide layer is thinner than the gate oxide layer; a control gate above the gate oxide layer; a floating gate above the tunneling oxide layer formed together with the control gate in the same process; a plurality of spacers formed on the sidewalls of the control gate and the floating gate; a gap formed between the control gate and the floating gate. The spacers of this flash memory are formed from polysilicon or other conductive materials, and the spacers are used for controlling the gap width.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings, FIG. 1A (Prior Art) is a cross-sectional view showing a conventional flash memory cell structure.

DESCRIPTION OF THE PREFERRED EMBODIMENTS

Figure 1A:
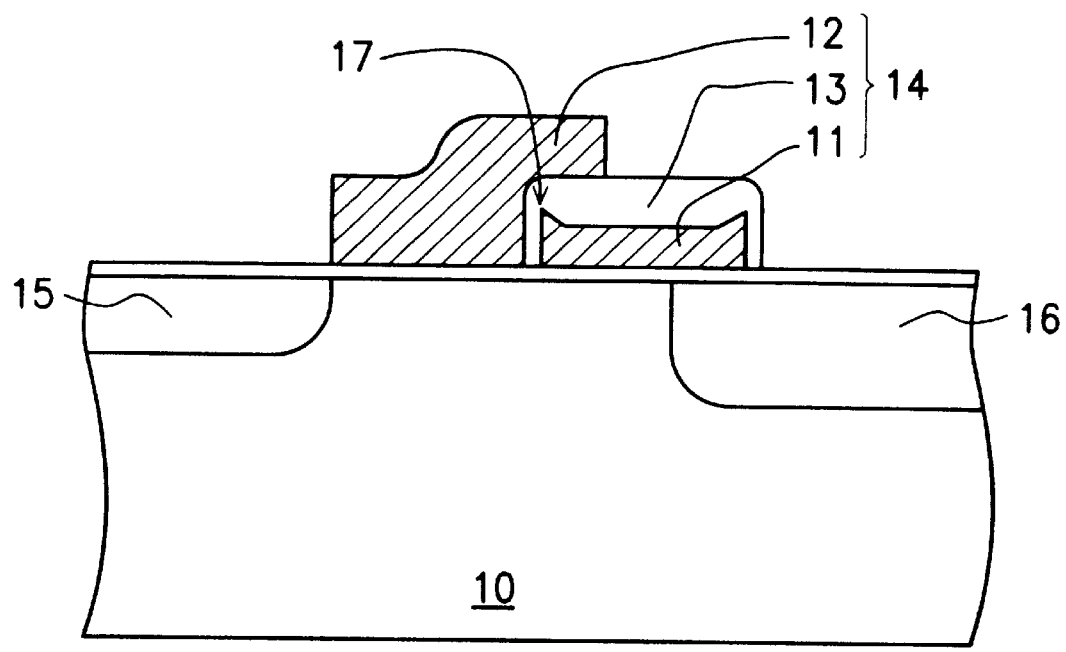
FIG. 1B (Prior Art) is a cross-sectional view showing two conventional flash memory cells using a common source region.
Figure 1B:
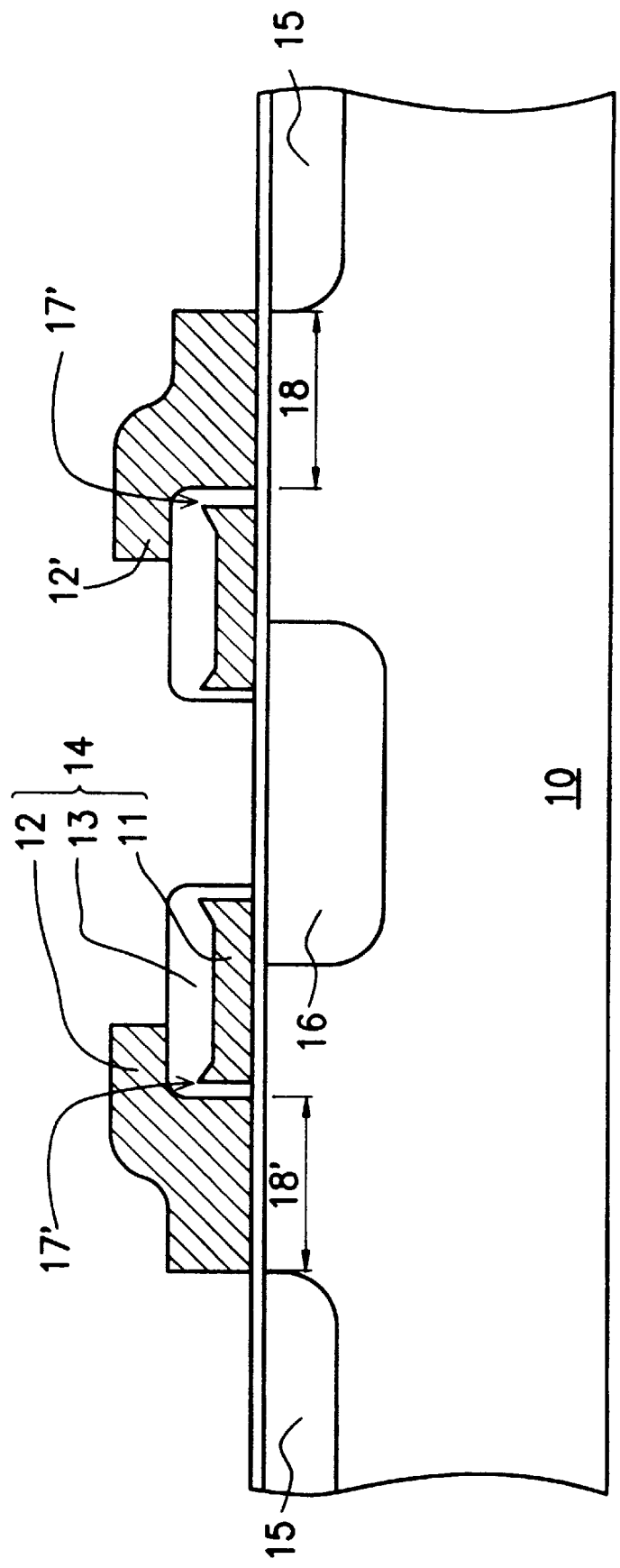

Reference will now be made in detail to the present preferred embodiments of the invention, examples of which are illustrated in the accompanying drawings. Wherever possible, the same reference numbers are used in the drawings and the description to refer to the same or like parts.

Figure 2A:
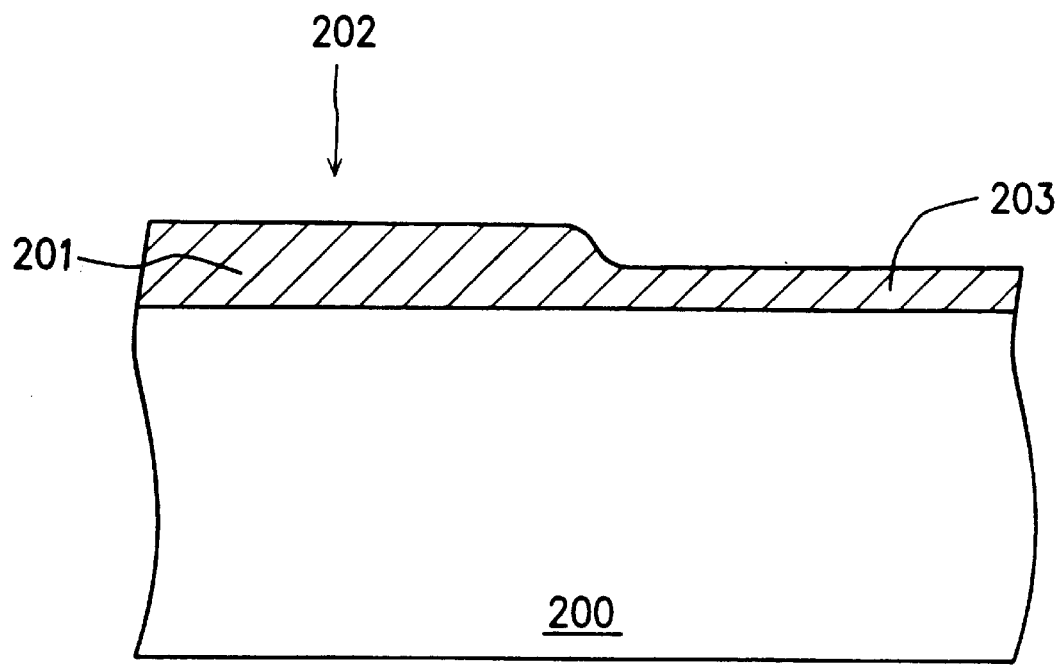
FIGS. 2A through 2D are cross-sectional views showing the progression of manufacturing steps in fabricating a split-gate source side injection flash EEPROM cell structure according to one preferred embodiment of this invention.

FIGS. 2A through 2D are cross-sectional views showing the progression of manufacturing steps in fabricating a split-gate source side injection flash EEPROM cell structure according to one preferred embodiment of this invention. First, as shown in FIG. 2A, a gate oxide layer 201 preferably having a thickness of about 150Å is formed above a semiconductor substrate 200 (for example, a silicon substrate). Next, a split-gate photomask is formed over the substrate 200 where a control gate 202 is desired, and then a portion of the gate oxide layer 201 is etched away. Thereafter, the split-gate photomask is removed, and then a tunneling oxide layer 203 (also called a second gate oxide layer) preferably having a thickness of about 90Å is formed over the silicon substrate 200. At the same time, the original gate oxide layer 201 has also grown to a thickness of about 180Å. As shown in FIG. 2A, the tunneling oxide layer 203 has a thickness smaller than gate oxide layer 201.

Figure 2B:
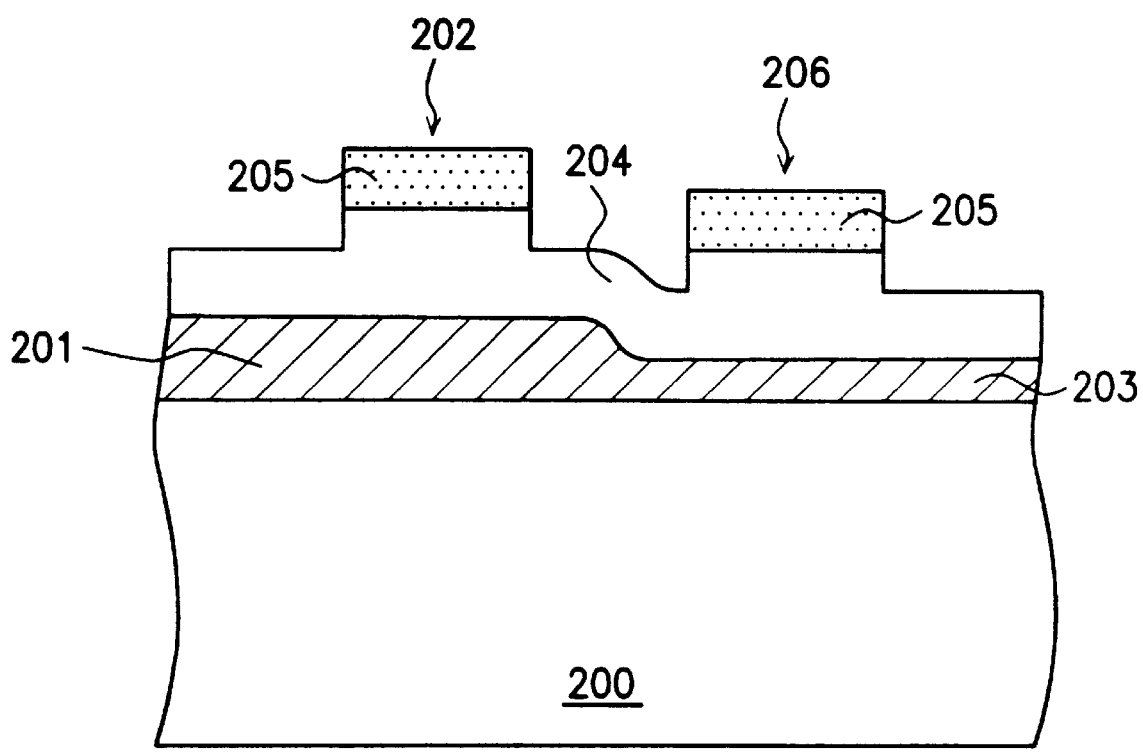

Next, as shown in FIG. 2B, a first polysilicon layer 204 preferably having a thickness of about 2000Å is deposited above the silicon substrate 200. Then, a tungsten silicide layer 205 preferably having a thickness of about 1200Å can be deposited over the first polysilicon layer 204. However, the step of forming a tungsten silicide layer can be omitted. In that case, thickness of deposition for the first polysilicon layer 204 has to be increased to about 4000Å instead of just 2000Å as before. Furthermore, the first polysilicon layer 204 can be a polysilicon-silicide (polycide) layer or a self-aligned silicide (Salicide) layer. Next, photolithographic and etching processes are used to remove the tungsten silicide layer 205 and a portion of the first polysilicon layer 204. Consequently, a portion of the control gate 202 and the floating gate 206 are simultaneously formed while a residual polysilicon layer having a thickness of about 200Å to 1000Å is left behind. The residual polysilicon layer covers areas outside the control gate 202 and floating gate 206 regions for protecting the gate oxide layer 201 and the tunneling oxide layer 203 as shown in FIG. 2B. Because the control gate 202 and the floating gate 206 are formed at the same time, no topographical problems arising out of a difference in height level will be encountered in the process. Therefore, the defective formation of stringers in a conventional fabricating method can be prevented.

Figure 2C:
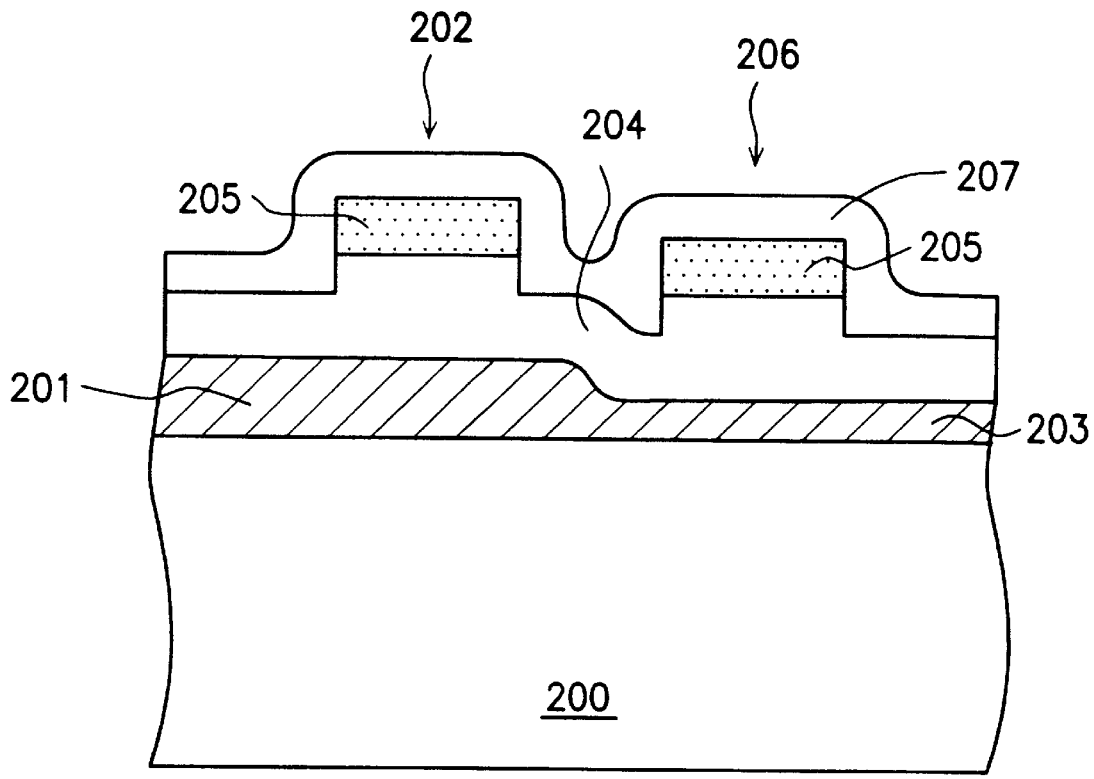
Figure 2D:
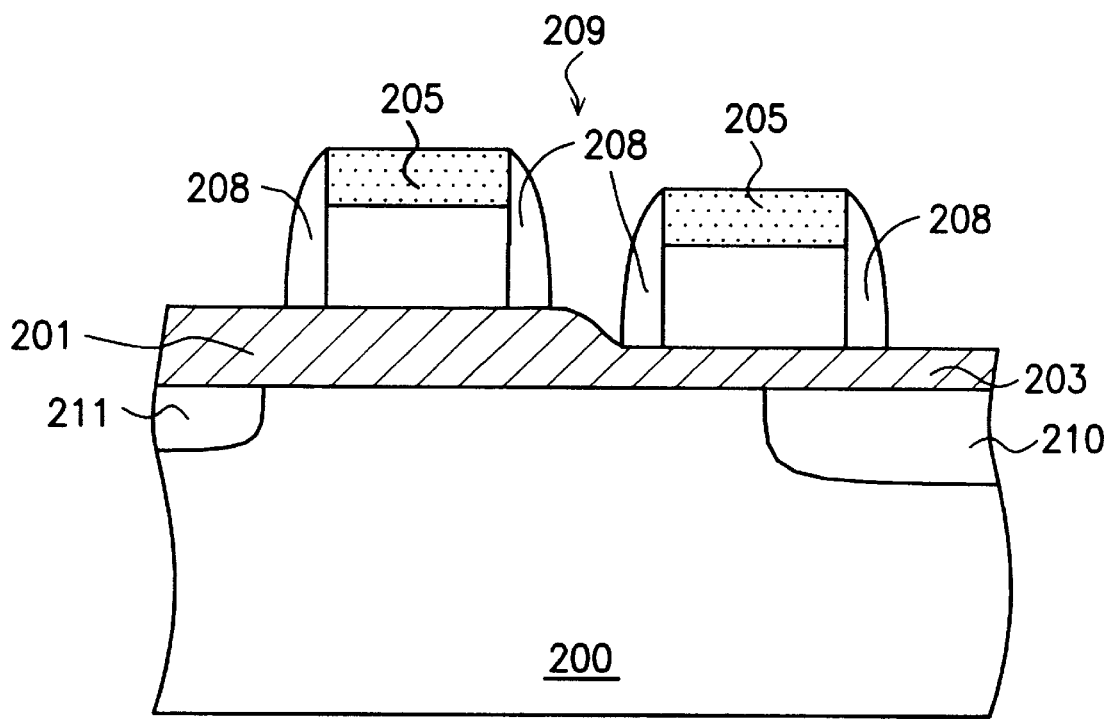

Next, as shown in FIG. 2C, a second polysilicon layer 207 preferably having a thickness of about 2000Å to 5000Å is formed over the silicon substrate 200. Then, as shown in FIG. 2D, the second polysilicon layer 207 is etched back to form spacers 208 on the sidewalls of the control gate 202 and the floating gate 206, and a gap 209 between the control gate 202 and the floating gate 206. Spacers 208 can be made from any conductive material. Furthermore, the width of the gap 209 in this invention can be controlled by the polysilicon spacers 208 or other conductive layer. Finally, the source and drain regions are formed. For example, a high-energy ion implant followed by a high temperature drive-in is performed to form a source region 210 that can withstand high input voltage, and then another ion implant is performed to form a drain region 211.

Furthermore, in this invention, another approach is a little polysilicon remained between the floating gate 206 and the control gate 202, a thermal oxidation process can be used to obtain a better oxide quality gap 209. For example, if a few hundred Angstroms of polysilicon layer are left after etching the second polysilicon layer 207, a thermal oxidation operation can easily oxidize this polysilicon layer to form a protective layer for the gap 209.

Figure 3:
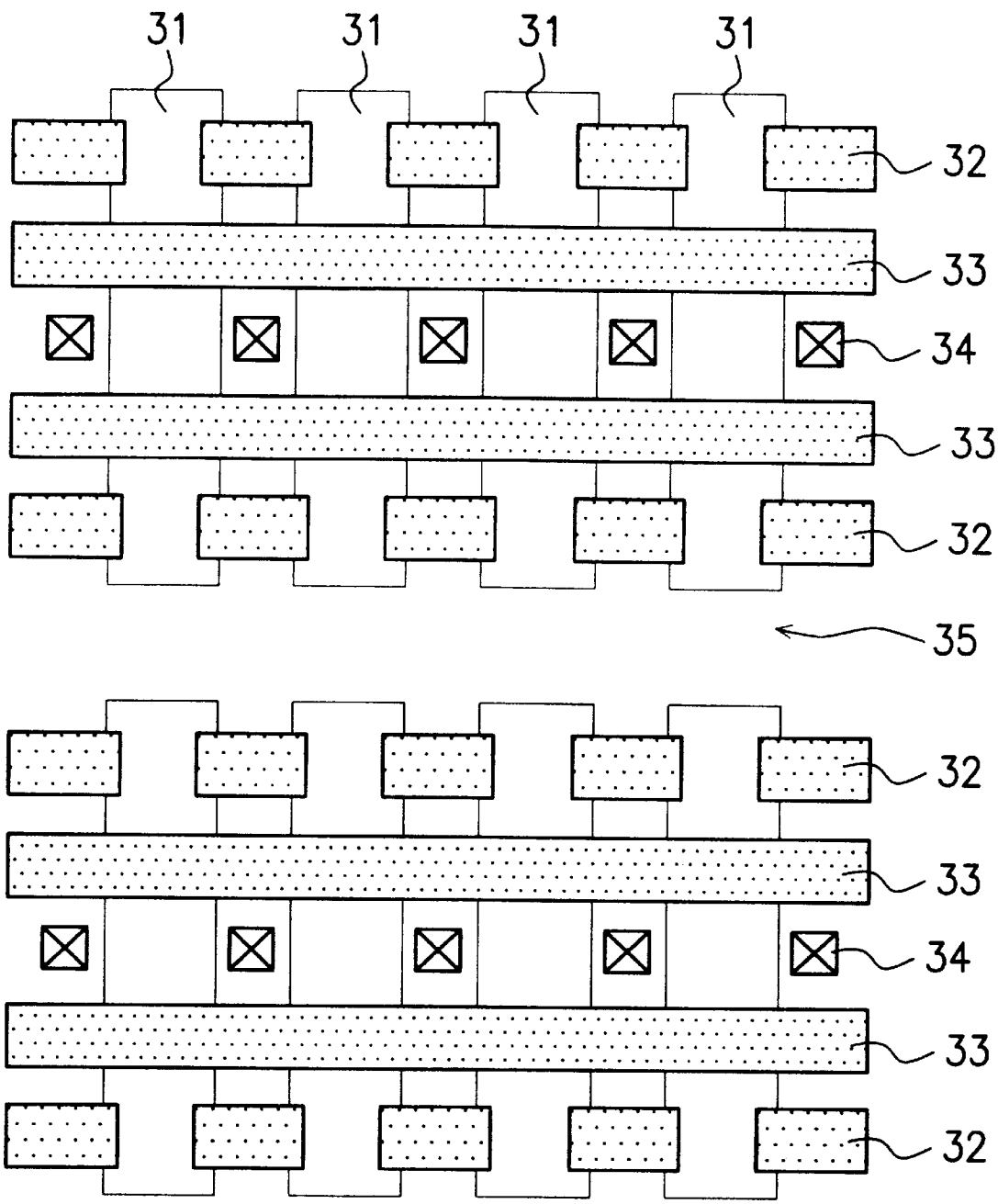
FIG. 3 is a layout diagram of a split-gate, source side injection, flash EEPROM cell array according to FIG. 2D of this invention.

FIG. 3 is a layout diagram of a split-gate, source side injection, flash EEPROM cell array according to FIG. 2D of this invention. In FIG. 3, the array includes field oxide regions 31 for memory cell isolation, floating gates 32, control gates 33, drain terminal connection points 34 and a common source line 35.

According to the split-gate flash memory of this invention, memory cell read, program, and erase operations are conducted using the voltages as described in Table 1 below:

TABLE 1

|  | Control Gate | Drain Terminal | Source Terminal | Substrate |
| --- | --- | --- | --- | --- |
| Program | 2V | 0V | 12V | 0V |
| Erase | 12V | 0V | 0V | 0V |
| Read | 3.3V | 2V | 0V | 0V |

When the memory cell is in a programming operation, the drain terminal connecting point 34 will be connected to the ground; a voltage slightly greater than the threshold voltage (in general, about 1V) is applied to the control gate terminal 33 of the memory, for example, about 2V; and then a high voltage will be applied to the common source line 35, for example, about 12V. Through the high voltage coupling of about 9V to the floating gate 32, hot carriers in the channel will inject from the source terminal to the floating gate. Because the programming efficiency is very high (a characteristic of source side injection), programming current can be very low.

When the memory cell is in a memory erasing operation, the drain connecting point 34, the common source line 35 and the substrate are all connected to ground; a high voltage is applied to the control gate terminal 33, for example, about 12V. Through the Fowler Norheim Tunneling effect between polysilicon layers, a low current can be used to achieve the erase function.

When the memory cell is in a reading cycle, the drain connection point 34 is coupled to a voltage source of about 2V; the common source line 35 and the substrate are connected to the ground; and a reading voltage is applied to the control gate terminal 33, for example, about 3.3V, where the reading current is slightly higher.

As a summary, this invention uses the same polysilicon in the same process to form the floating gate and the control gate of the flash memory. Consequently, not only can the gap width between a floating gate and a control gate be carefully controlled, the gap width between spacers can also be varied to any desirable value too. Secondly, since the control gate and the floating gate are fabricated at the same time, topographic problems arising from a difference in height level in a conventional fabricating method can be avoided. Therefore, defective formation of stringers after etching in a convention fabricating method can be prevented.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A split-gate source side injection flash EEPROM array structure comprising:

a semiconductor substrate;

a gate oxide layer formed above a portion of the substrate and having a long and narrow top profile;

a tunneling oxide layer formed above a portion of the substrate, having a long and narrow top profile, and lying next to the gate oxide layer;

a control gate formed above the gate oxide layer;

a floating gate formed above the tunneling oxide layer, wherein a portion of the floating gate is formed from the same material as a portion of the control gate;

a plurality of spacers having conductivity formed on the sidewalls of the control gate and the floating gate;

a gap formed between the control gate and the floating gate, wherein a width of the gap is controlled by the spacers;

a source region formed in the semiconductor substrate with part of it lying underneath the floating gate; and a drain region formed in the semiconductor substrate.

2. The structure of claim 1, wherein the semiconductor substrate includes a silicon substrate.

3. The structure of claim 1, wherein the control gate is formed by depositing a polysilicon layer above the gate oxide layer.

4. The structure of claim 1, wherein both the control gate and the floating gate are formed by depositing a tungsten silicide layer above a polysilicon layer.

5. The structure of claim 1, wherein both the control gate and the floating gate are formed by depositing a polycide layer above a polysilicon layer.

6. The structure of claim 1, wherein both the control gate and the floating gate are formed by depositing a self-aligned silicide layer above a polysilicon layer.

7. The structure of claim 1, wherein the floating gate is formed by depositing a polysilicon layer above the gate oxide layer.

8. The structure of claim 1, wherein the spacers are formed from a material including polysilicon.

9. The structure of claim 8, wherein the spacers are formed from a material including a conductive material.

10. The structure of claim 1, further comprising a memory cell, the memory cell adapted to perform a memory cell operation.

11. The memory cell of claim 10, the memory cell adapted to perform a programming operation, the memory cell having:

a drain region connected to a ground; and the substrate connected to the ground.

12. The programming operation as in claim 11 further comprising:

a high voltage applied to a source region; and a voltage higher than a threshold voltage applied to a control gate.

13. The structure of claim 10 further comprising:

the source region connected to the ground; and a high voltage applied to the control gate.

14. The memory cell of claim 10, wherein the memory cell is adapted to perform a reading operation further comprising:

a voltage greater than ground applied to the drain region; and a reading voltage applied to the control gate.

15. A split-gate source side injection flash EEPROM array structure above a semiconductor substrate, comprising:
- a gate oxide layer formed above a portion of the substrate and having a long and narrow top profile;
- a tunneling oxide layer formed above a portion of the substrate, having a long and narrow top profile, lying next to the gate oxide layer, an that the tunneling oxide layer is thinner than the gate oxide layer;
- a control gate above the gate oxide layer;
- a floating gate above the tunneling oxide layer formed together with the control gate in the same process, wherein a portion of the floating gate is formed from the same material as a portion of the control gate;
- a plurality of spacers having conductivity formed on the sidewalls of the control gate and the floating gate; and
- a gap formed between the control gate and the floating gate, wherein a width of the gap is controlled be the spacers.

16. The structure of claim 15, wherein the semiconductor substrate includes a silicon substrate.

17. The structure of claim 15, wherein the control gate is formed be depositing a polysilicon layer above the gate oxide layer.

18. The structure of claim 15, wherein both the control gate and the floating gate are formed by depositing a tungsten silicide layer above a polysilicon layer.

19. The structure of claim 15, wherein both the control gate and the floating gate are formed by depositing a polycide layer above a polysilicon layer.

20. The structure of claim 15, wherein both the control gate and the floating gate are formed by depositing a self-aligned silicide layer above a polysilicon layer.

21. The structure of claim 15, wherein the spacers are formed from a material including polysilicon.

22. The structure of claim 15, wherein the spacers are formed from a material including a conductive material.

* * * * *

UNITED STATES PATENT AND TRADEMARK OFFICE
CERTIFICATE OF CORRECTION

PATENT NO. : 6,066,875
DATED : May 23, 2000
INVENTOR(S) : Chen

It is certified that error appears in the above-indentified patent and that said Letters Patent is hereby corrected as shown below:

In column 7, line 17, delete "gap is controlled be the spacers" and insert -- gap is controlled by the spacers -- .

Signed and Sealed this

Tenth Day of April, 2001

Attest:

NICHOLAS P. GODICI

Attesting Officer   Acting Director of the United States Patent and Trademark Office